United States Patent
Park et al.

(10) Patent No.: US 11,417,376 B2
(45) Date of Patent: Aug. 16, 2022

(54) SEMICONDUCTOR DEVICE AND OPERATING METHOD OF A SEMICONDUCTOR DEVICE

(71) Applicant: SK hynix Inc., Icheon-si (KR)

(72) Inventors: Jong Kyung Park, Guri-si (KR); Ji Hyun Seo, Seoul (KR); Hye Eun Heo, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/153,658

(22) Filed: Jan. 20, 2021

(65) Prior Publication Data

US 2021/0142835 A1 May 13, 2021

Related U.S. Application Data

(63) Continuation of application No. 16/599,692, filed on Oct. 11, 2019, now Pat. No. 10,930,331.

(30) Foreign Application Priority Data

Jun. 10, 2019 (KR) .................. 10-2019-0068167

(51) Int. Cl.
*G11C 7/12* (2006.01)
*G11C 8/08* (2006.01)
*G11C 7/10* (2006.01)

(52) U.S. Cl.
CPC ............. *G11C 8/08* (2013.01); *G11C 7/109* (2013.01); *G11C 7/1096* (2013.01); *G11C 7/12* (2013.01)

(58) Field of Classification Search
CPC ......... G11C 8/08; G11C 7/109; G11C 7/1096; G11C 7/12; G11C 11/5628; G11C 16/0483; G11C 16/10; G11C 16/08; G11C 16/3404; G11C 16/24; G11C 16/30
USPC ........................................ 365/185.24, 189.16
See application file for complete search history.

(56) References Cited

U.S. PATENT DOCUMENTS

| | | | |
|---|---|---|---|
| 9,286,987 B1* | 3/2016 | Dong ................. | G11C 16/0466 |
| 2005/0254309 A1 | 11/2005 | Kwon et al. | |
| 2009/0135658 A1* | 5/2009 | Park .................. | G11C 16/0483 365/185.23 |
| 2010/0329021 A1 | 12/2010 | Lee | |
| 2011/0194346 A1 | 8/2011 | Yoon et al. | |

(Continued)

FOREIGN PATENT DOCUMENTS

KR  1020090026510 A  3/2009

*Primary Examiner* — Michael T Tran
(74) *Attorney, Agent, or Firm* — William Park & Associates Ltd.

(57) ABSTRACT

A semiconductor device includes a memory string coupled between a source line and a bit line and including a plurality of memory cells, a plurality of word lines, a peripheral circuit configured to apply a program voltage to a word line, apply a first pass voltage to a word line coupled to a first memory cell adjacent to the selected memory cell, and apply a second pass voltage to a second memory cell adjacent to the selected memory cell, and control logic configured to control the peripheral circuit so that the first pass voltage has a higher voltage level than the second pass voltage when a program target level of the selected memory cell is lower than a first threshold value, and the first pass voltage has a lower voltage level than the second pass voltage when the program target level is higher than a second threshold value.

20 Claims, 15 Drawing Sheets

(56) References Cited

U.S. PATENT DOCUMENTS

| | | | |
|---|---|---|---|
| 2012/0269001 A1* | 10/2012 | Ueno | G11C 16/14 365/185.22 |
| 2013/0128660 A1 | 5/2013 | Yoo et al. | |
| 2013/0163335 A1* | 6/2013 | Kim | G11C 16/3436 365/185.12 |
| 2013/0235671 A1 | 9/2013 | Lee | |
| 2014/0126291 A1* | 5/2014 | Mihnea | G11C 11/5671 365/185.17 |
| 2014/0219025 A1* | 8/2014 | Kang | G11C 7/065 365/185.11 |
| 2015/0036426 A1* | 2/2015 | Kwak | G11C 16/3459 365/185.03 |
| 2015/0262678 A1 | 9/2015 | Kim et al. | |
| 2015/0262679 A1 | 9/2015 | Shimura | |
| 2015/0262693 A1 | 9/2015 | Kondo | |
| 2016/0049192 A1 | 2/2016 | Lee | |
| 2016/0148691 A1 | 5/2016 | Rabkin et al. | |
| 2016/0225454 A1* | 8/2016 | Kim | G11C 16/10 |
| 2016/0343414 A1* | 11/2016 | Lee | G11C 7/00 |
| 2016/0372185 A1* | 12/2016 | Shim | G11C 16/0483 |
| 2017/0025176 A1 | 1/2017 | Lee | |
| 2017/0140829 A1* | 5/2017 | Park | G11C 16/20 |
| 2017/0154680 A1 | 6/2017 | Lee | |
| 2018/0033492 A1* | 2/2018 | Seo | G11C 16/0483 |
| 2018/0046574 A1 | 2/2018 | Yoon et al. | |
| 2018/0047451 A1 | 2/2018 | Tokiwa | |
| 2018/0114581 A1* | 4/2018 | Zhao | G11C 16/08 |
| 2018/0137919 A1 | 5/2018 | Lee | |
| 2018/0181305 A1 | 6/2018 | Futatsuyama | |
| 2018/0247688 A1* | 8/2018 | Lee | G11C 16/24 |
| 2019/0074062 A1 | 3/2019 | Chen et al. | |
| 2019/0109190 A1 | 4/2019 | Carlson | |
| 2019/0156893 A1 | 5/2019 | Lee | |
| 2019/0180824 A1* | 6/2019 | Hsu | G11C 16/0483 |
| 2019/0196744 A1 | 6/2019 | Kim | |
| 2019/0198118 A1 | 6/2019 | Shim et al. | |
| 2019/0206688 A1 | 7/2019 | Violette et al. | |
| 2019/0371406 A1 | 12/2019 | Yang et al. | |
| 2019/0392874 A1 | 12/2019 | Yabe | |
| 2020/0118630 A1 | 4/2020 | Lin et al. | |
| 2020/0152282 A1 | 5/2020 | Yang et al. | |
| 2020/0168276 A1 | 5/2020 | Yang | |
| 2020/0202962 A1* | 6/2020 | Chen | G11C 16/3427 |
| 2020/0211663 A1* | 7/2020 | Baraskar | G11C 16/3459 |
| 2020/0303410 A1 | 9/2020 | Kanamori et al. | |
| 2020/0381064 A1* | 12/2020 | Her | G11C 16/10 |
| 2020/0395094 A1* | 12/2020 | Kim | G11C 29/42 |
| 2021/0050051 A1* | 2/2021 | Yang | G11C 11/4094 |
| 2021/0124529 A1* | 4/2021 | Nishikawa | G06F 3/0679 |
| 2021/0183458 A1* | 6/2021 | Lee | G11C 16/08 |
| 2021/0193232 A1* | 6/2021 | Konno | G11C 16/08 |
| 2021/0264993 A1* | 8/2021 | Kim | G11C 16/3418 |
| 2021/0272634 A1* | 9/2021 | Shirota | G11C 16/0483 |
| 2021/0280251 A1* | 9/2021 | Lee | G11C 8/12 |
| 2022/0036954 A1* | 2/2022 | Yu | G11C 16/32 |
| 2022/0051729 A1* | 2/2022 | Cho | H01L 25/18 |
| 2022/0059157 A1* | 2/2022 | Cui | G11C 11/4094 |
| 2022/0059168 A1* | 2/2022 | Seo | G11C 16/14 |
| 2022/0076754 A1* | 3/2022 | Choi | G11C 16/24 |
| 2022/0101923 A1* | 3/2022 | Park | G11C 16/3459 |
| 2022/0122678 A1* | 4/2022 | Kim | G11C 16/24 |

* cited by examiner

SEMICONDUCTOR DEVICE AND OPERATING METHOD OF A SEMICONDUCTOR DEVICE

CROSS-REFERENCE TO RELATED APPLICATION

The present application is a continuation application of U.S. patent application Ser. No. 16/599,692, filed on Oct. 11, 2019, and claims priority under 35 U.S.C. § 119(a) to Korean patent application number 10-2019-0068167 filed on Jun. 10, 2019, in the Korean Intellectual Property Office, the entire disclosure of which is incorporated herein by reference.

BACKGROUND

1. Technical Field

Various embodiments relate generally to an electronic device and, more particularly, to a semiconductor device and a method of operating the semiconductor device.

2. Related Art

Semiconductor memory devices are storage devices made of semiconductor materials such as silicon (Si), germanium (Ge), gallium arsenide (GaAs), and indium phosphide (Inp). Semiconductor memory devices are classified as volatile memory devices or non-volatile memory devices.

Volatile memory devices may lose stored data when powered off. Examples of volatile memory devices may include Static RAM (SRAM), Dynamic RAM (DRAM), and Synchronous DRAM (SDRAM). Nonvolatile memory devices may retain stored data regardless of power on/off conditions. Examples of the nonvolatile memory devices may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. Flash memories may be generally classified as NOR-type memories or NAND-type memories.

SUMMARY

Various embodiments of the present disclosure provide a semiconductor device having improved operating characteristics and an operating method thereof.

According to an embodiment, a semiconductor device may include a memory string coupled between a source line and a bit line and including a plurality of memory cells. The semiconductor device may also include a plurality of word lines each coupled to a respective memory cell of the plurality of memory cells. The semiconductor device may also include a peripheral circuit configured to: apply a program voltage to a selected word line, of the plurality of word lines, coupled to a selected memory cell, of the plurality of memory cells; apply a first pass voltage to a first word line, of the plurality of word lines, coupled to a first memory cell, of the plurality of memory cells, adjacent to the selected memory cell; and apply a second pass voltage to a second word line, of the plurality of word lines, coupled to a second memory cell, of the plurality of memory cells, adjacent to the selected memory cell. The semiconductor device may also include control logic configured to control the peripheral circuit so that the first memory cell is programmed before the selected memory cell is programmed, the second memory cell is programmed after the selected memory cell is programmed, the first pass voltage has a higher voltage level than the second pass voltage when a program target level of the selected memory cell is lower than a first threshold value, and the first pass voltage has a lower voltage level than the second pass voltage when the program target level is higher than a second threshold value.

According to an embodiment, a semiconductor device may include first, second, third, and fourth word lines coupled to first, second, third, and fourth memory cells, respectively. A method of operating the semiconductor device may include: programming the second memory cell to a first program level less than a first threshold value; selecting the third memory cell adjacent to the programmed second memory cell; determining that a program target level of the third memory cell is greater than a second threshold value; programming the third memory cell by applying a program voltage to the third word line; and applying a first pass voltage to the second word line and applying a second pass voltage to the fourth word line coupled to the fourth memory cell adjacent to the third memory cell, wherein the first pass voltage has a lower voltage level than the second pass voltage.

According to an embodiment, a semiconductor device may include first, second, third, and fourth word lines coupled to first, second, third, and fourth memory cells, respectively. A method of operating the semiconductor device may include: programming the first memory cell; selecting the second memory cell adjacent to the programmed first memory cell; determining that a program target level of the second memory cell is greater than a first threshold value; programming the second memory cell by applying a program voltage to the second word line; and applying a first pass voltage to the first word line and applying a second pass voltage to the third word line coupled to the third memory cell adjacent to the second memory cell, wherein the first pass voltage has a higher voltage level than the second pass voltage.

DETAILED DESCRIPTION

Hereinafter, various embodiments are described in detail with reference to the accompanying drawings. In the following description, a detailed explanation of related functions and constitutions may be omitted for simplicity and conciseness. In addition, embodiments may be embodied in different forms and should not be construed as being limited to the embodiments set forth herein. Rather, presented embodiments are provided so that this disclosure will be enabling to those skilled in the art.

It is also noted that in this specification, "connected/coupled" refers to one component not only directly coupling another component but also indirectly coupling another component through an intermediate component. In the specification, when an element is referred to as "comprising" or "including" a component, it does not exclude other components but may further include other components unless a description to the contrary is specifically pointed out in context.

Figure 1:
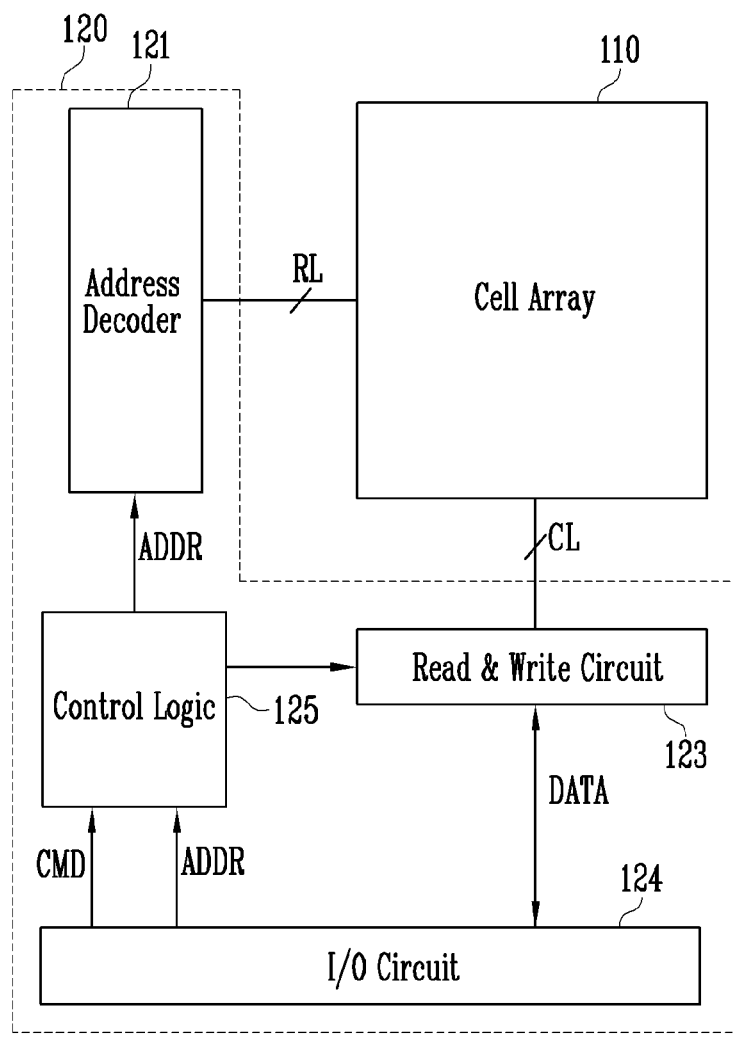
FIG. 1 is a block diagram illustrating the configuration of a semiconductor device according to an embodiment of the present disclosure.

FIG. 1 is a block diagram illustrating the configuration of a semiconductor device 100 according to an embodiment of the present disclosure. Referring to FIG. 1, the semiconductor device 100 may include a cell array 110 and a peripheral circuit 120.

The cell array 110 may be coupled to an address decoder 121 through row lines RL and to a read and write circuit 123 through column lines CL. The row lines RL may be word lines and the column lines CL may be bit lines. However, the word lines and the bit lines may be relative to each other. In other words, the row lines RL may be bit lines and the column lines CL may be word lines. In addition, the row lines RL may further include a source select line, a drain select line, and the like.

The cell array 110 may include a plurality of memory strings, and the plurality of memory strings may be arranged in a horizontal direction or a vertical direction to a substrate. In addition, the cell array 110 may include a plurality of memory blocks, and each of the plurality of memory blocks may include a plurality of pages. For example, the semiconductor device 100 may perform erase operations in units of memory blocks and perform program operations or read operations in units of pages.

The peripheral circuit 120 may include the address decoder 121, the read and write circuit 123, an input/output circuit 124, and control logic 125.

The control logic 125 may be implemented as hardware, software, or a combination of hardware and software. For example, the control logic 125 may be a control logic circuit operating in accordance with an algorithm and/or a processor executing control logic code. The control logic 125 may be coupled to the address decoder 121, the read and write circuit 123, and the input/output circuit 124. The control logic 125 may receive a command CMD and an address ADDR from the input/output circuit 124 and control the address decoder 121 and the read and write circuit 123 to perform an internal operation in response to the received command CMD.

The address decoder 121 may be coupled to the cell array 110 through the row lines RL. For example, the address decoder 121 may be coupled to the cell array 110 through word lines, a source select line, and the drain select line. In addition, the control logic 125 may control the address decoder 121 to control the row lines RL. Therefore, the address decoder 121 may receive the address ADDR from the control logic 125 and select one of the memory blocks of the cell array 110 in response to the received address ADDR.

Program operations and read operations of the semiconductor device 100 may be performed in units of pages. Therefore, during a program operation or a read operation, the address ADDR may include a block address and a row address. The address decoder 121 may decode the block address included in the received address ADDR and select one of the memory blocks according to the decoded block address. The address decoder 121 may decode the row address included in the received address ADDR and select one of the memory blocks according to the decoded row address.

Erase operations of the semiconductor device 100 may be performed in units of memory blocks. Therefore, during an erase operation, the address ADDR may include a block address. The address decoder 121 may decode the block address and select one of the memory blocks according to the decoded block address.

The read and write circuit 123 may be coupled to the cell array 110 through the column lines CL. During a program operation, the read and write circuit 123 may transfer data DATA received from the input/output circuit 124 to the column lines CL, and memory cells of the selected page may be programmed in response to the transferred data DATA. The data DATA may be single-bit data or multi-bit data to be programmed into each of the memory cells. During a read operation, the read and write circuit 123 may read the data DATA from the memory cells of the selected page through the column lines CL and output the read data DATA to the input/output circuit 124. During an erase operation, the read and write circuit 123 may float the column lines CL. The program operation and the erase operation may include a verify operation. The verify operation may be performed in a similar manner to the read operation.

According to the above-described configuration, the memory cells may be programmed according to a single-level cell (SLC) method or a multi-level cell (MLC) method. In addition, the control logic 125 may control the semiconductor device 100 to perform a program operation in a multi-step method. According to the multi-step method, a program operation may be performed a plurality of times to achieve a desired program state. Examples of the multi-step method may include a pre/main program method, a reprogram method, and a shadow program method.

The control logic 125 may control the peripheral circuit 120 to adjust a level of a pass voltage for neighboring memory cells according to a program target level of a selected memory cell during a program operation.

The peripheral circuit 120 may apply a program voltage to a word line coupled to the selected memory cell, apply a first pass voltage to an unselected word line coupled to a first memory cell adjacent to the selected memory cell, and apply a second pass voltage to a second memory cell adjacent to the selected memory cell during the program operation. The peripheral circuit 120 may apply a normal pass voltage to unselected word lines. The first memory cell may be programmed before the selected memory cell is programmed. The second memory cell may be programmed after the selected memory cell is programmed. When memory cells coupled in series are sequentially programmed, the first memory cell may be adjacent to the selected memory cell in a reverse direction to a program direction, whereas the second memory cell may be adjacent to the selected memory cell in the program direction.

When the program target level of the selected memory cell is less than a first threshold value, the first pass voltage may have a greater voltage level than the second pass voltage. When the program target level is greater than a second threshold value, the first pass voltage may have a lower voltage level than the second pass voltage. In addition, the second threshold value may be greater than the first threshold value. However, the first threshold value and the second threshold value may be the same as each other.

By this control method, the location of the charge distribution of the programmed memory cell may be adjusted. More specifically, when the program target level is less than the first threshold value, the charge distribution of the selected memory cell may be located adjacent to the first memory cell. In other words, the charge distribution of the programmed memory cell may be inclined in the reverse direction to the program direction. When the program target level is greater than the second threshold value, the charge distribution of the selected memory cell may be located adjacent to the second memory cell. In other words, the charge distribution of the programmed memory cell may be inclined in the program direction.

Therefore, during a program operation, a distance between charge distributions of adjacent memory cells may be adjusted, and interference between the adjacent memory cells may be reduced. Even when the selected memory cell is programmed to a high program level after the first memory cell is programmed to a low program level, because the charge distribution of the first memory cell and the charge distribution of the second memory cell are separated from each other, damage to data of the first memory cell may be reduced or prevented. As a result, program characteristics of the semiconductor device and data reliability may be improved.

Figure 2:
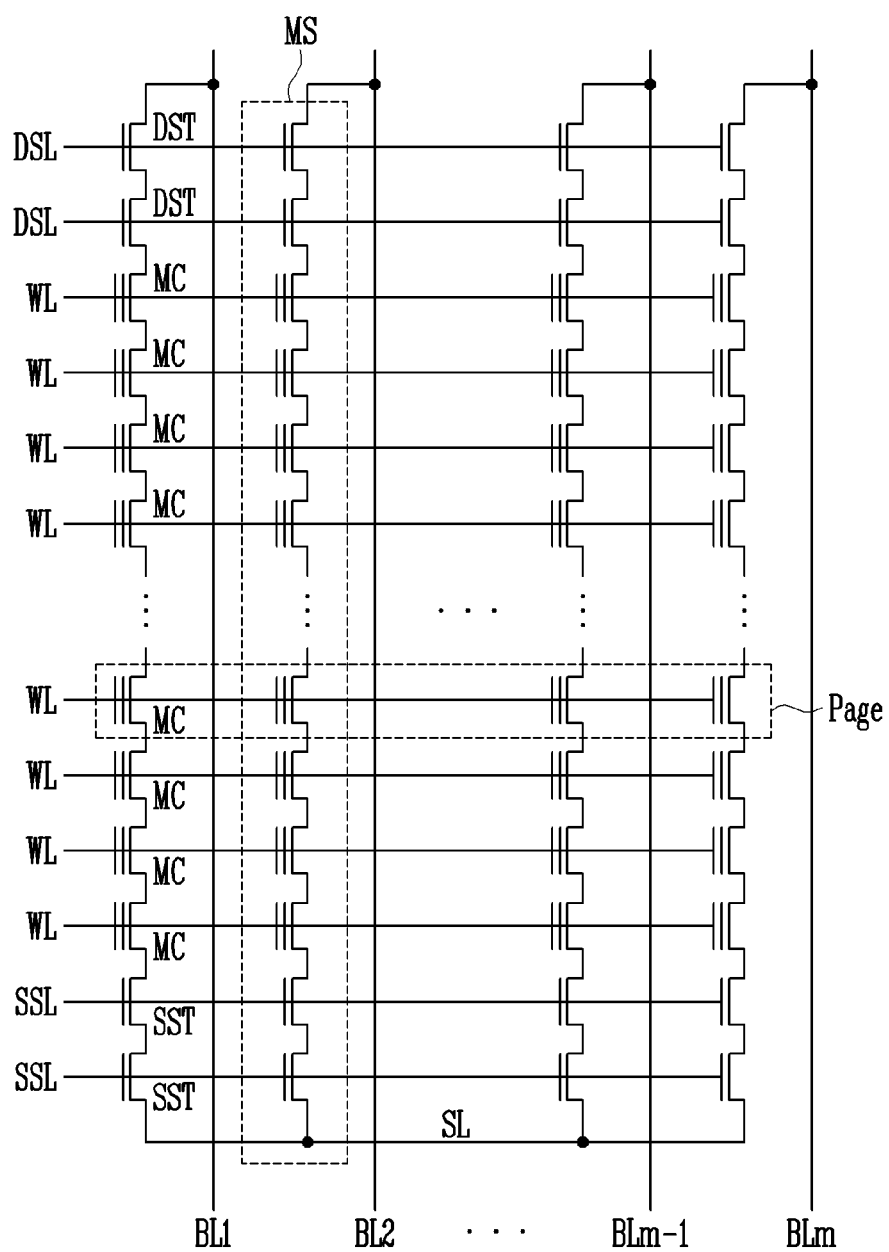
FIGS. 2 to 4 are circuit diagrams illustrating a cell array structure of a semiconductor device according to an embodiment of the present disclosure.
Figure 3:
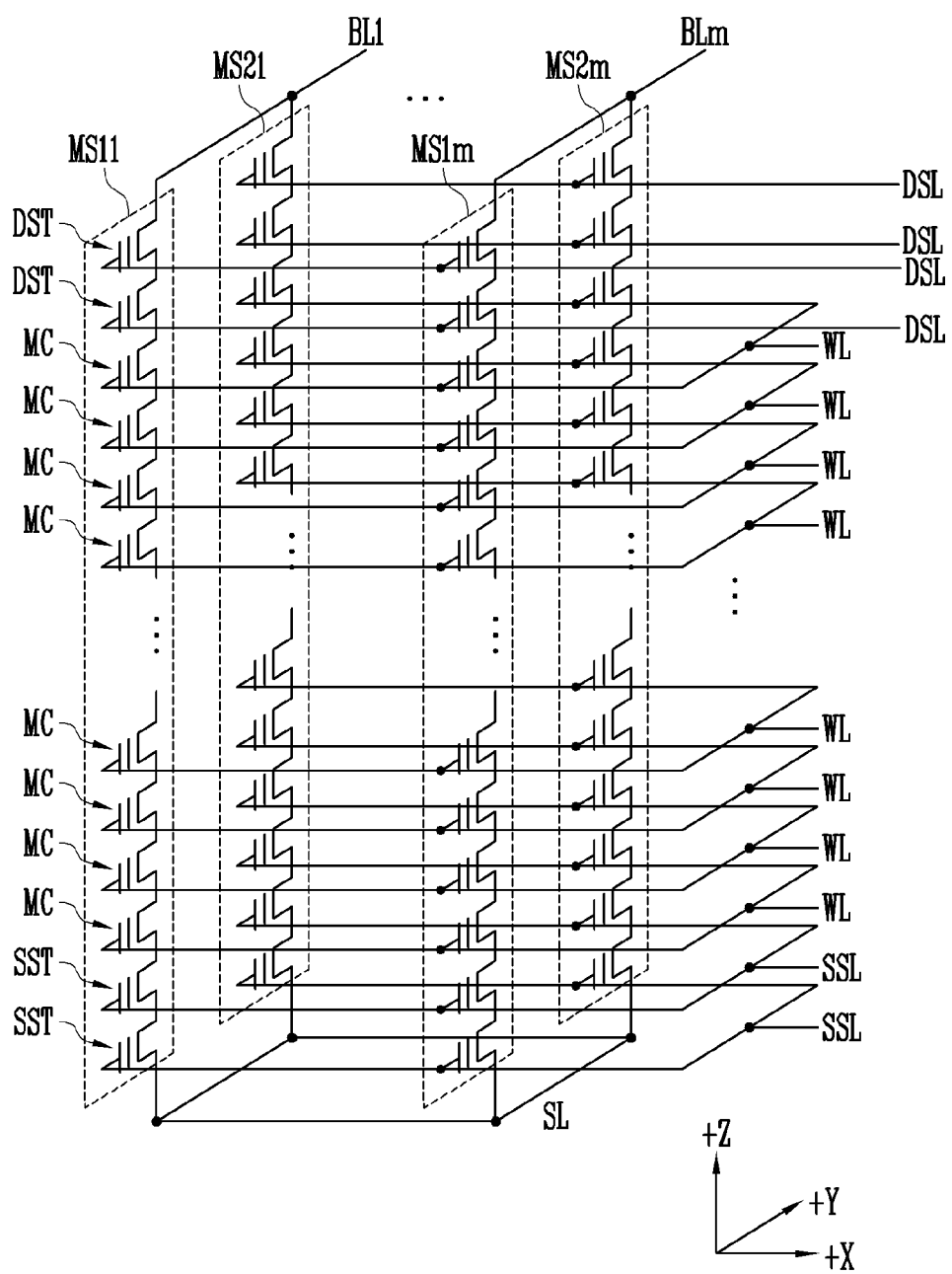
Figure 4:
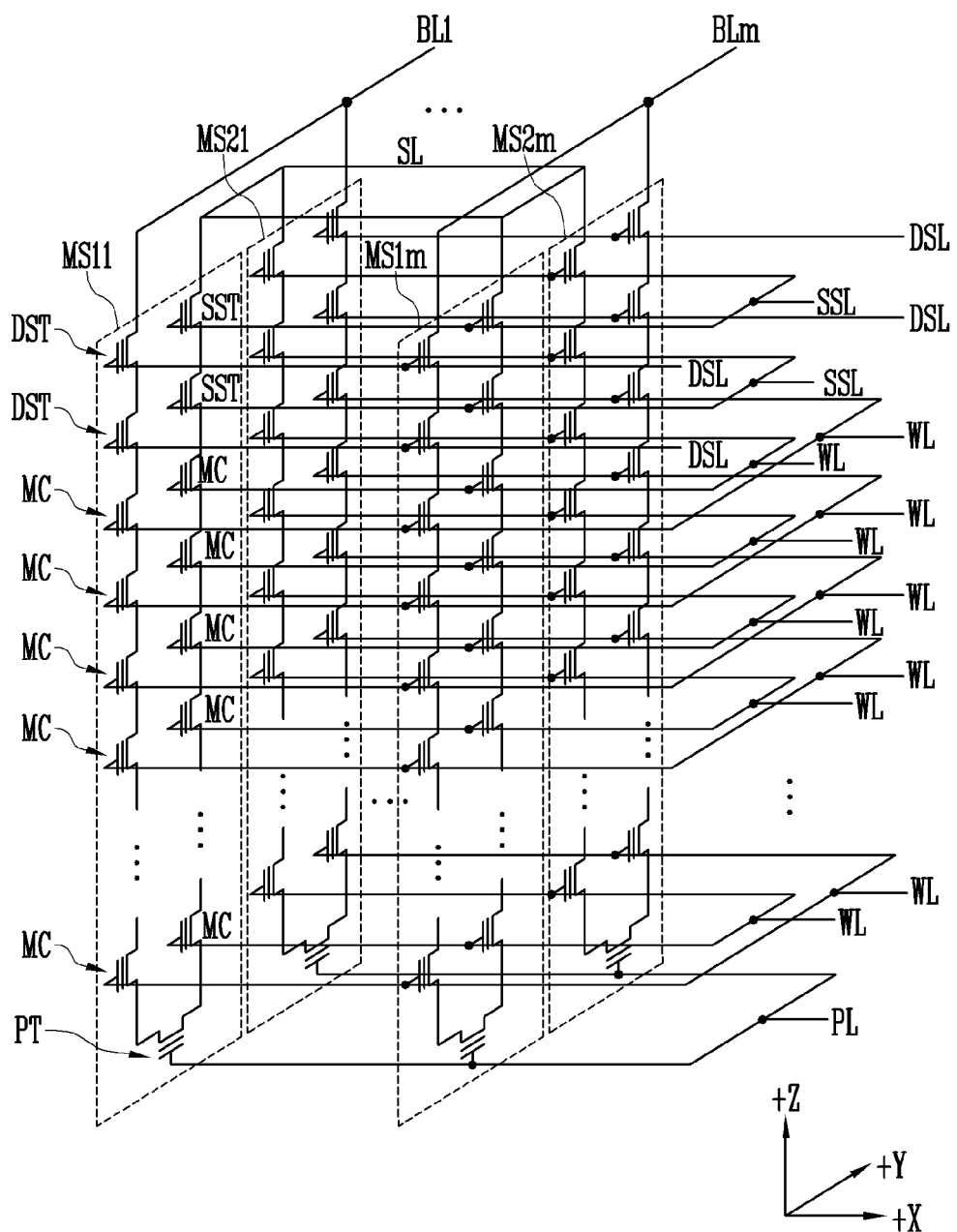

FIGS. 2 to 4 are circuit diagrams illustrating a cell array structure of a semiconductor device according to an embodiment of the present disclosure.

FIG. 2 illustrates an embodiment of memory strings MS arranged in two dimensions. A cell array may include a plurality of memory blocks BLK. Each of the memory blocks BLK may include memory cells MC arranged in two dimensions.

Referring to FIG. 2, the memory block BLK may include the plurality of memory strings MS coupled between bit lines BL1 to BLm and a source line SL. In addition, each of the memory string MS may include at least one drain select transistor DST, a plurality of memory cells MC, and at least one source select transistor SST coupled in series with each other. In FIG. 2, 'm' may be an integer of 2 or more.

In addition, each of the memory strings MS may further include at least one dummy memory cell coupled between the drain select transistor DST and the memory cells MC and/or between the source select transistor SST and the memory cells MC.

Gate electrodes of the memory cells MC may be coupled to word lines WL. Word line voltages (program voltage, pass voltage, and read voltage) for driving may be applied to each of the word lines WL. Gate electrodes of the drain select transistors DST may be coupled to a drain select line DSL. Gate electrodes of the source select transistor SST may be coupled to a source select line SSL.

According to the above-described structure, the memory cells MC which are coupled to the same word line WL and programmed at the same time may form a single page and one memory block BLK may include a plurality of pages.

FIG. 3 illustrates an embodiment of the memory strings MS arranged in three dimensions. A cell array may include the plurality of memory blocks BLK. Each of the memory blocks BLK may include the memory cells MC arranged in three dimensions.

Referring to FIG. 3, the memory block BLK may include a plurality of memory strings MS11 to MS1$m$ and MS21 to MS2$m$ coupled between bit lines BL1 to BLm and a source line SL. Each of the plurality of memory strings MS11 to MS1$m$ and MS21 to MS2$m$ may extend in a +Z direction. The +Z direction may refer to a direction in which the memory cells MC are stacked. In FIG. 3, 'm' may be an integer of 2 or more.

Each of the memory strings MS11 to MS1$m$ and MS21 to MS2$m$ may include at least one source select transistor SST, the plurality of memory cells MC, and at least one drain select transistor DST stacked in a sequential manner. In addition, each of the memory strings MS11 to MS1$m$ and MS21 to MS2$m$ may further include at least one dummy memory cell coupled between the drain select transistor DST and the memory cells MC and/or between the source select transistor SST and the memory cells MC.

The source select transistors SST included in one of the memory strings MS11 to MS1$m$ and MS21 to MS2$m$ may be coupled in series between the memory cells MC and the source line SL. In addition, the source select transistors SST at the same level may be coupled to the same source select line SSL.

The memory cells MC included in one of the memory strings MS11 to MS1$m$ and MS21 to MS2$m$ may be coupled in series between the source select transistor SST and the drain select transistor DST. In addition, the memory cells MC at the same level may be coupled to the same word line WL.

The drain select transistors DST included in one of the memory strings MS11 to MS1$m$ and MS21 to MS2$m$ may be coupled in series between the bit lines BL1 to BLm and the memory cells MC. The drain select transistors DST at the same level, among the drain select transistors DST of the memory strings MS11 to MS1$m$ and MS21 to MS2$m$ arranged in the same row (+X direction), may be coupled to the same drain select line DSL. In addition, the drain select transistors DST arranged in different rows (+X direction) may be coupled to different drain select lines DSL.

FIG. 4 illustrates an embodiment of the memory strings MS arranged in three dimensions. A cell array may include the plurality of memory blocks BLK. Each of the memory blocks BLK may include the memory cells MC arranged in three dimensions.

Referring to FIG. 4, the memory block BLK may include the plurality of memory strings MS11 to MS1$m$ and MS21 to MS2$m$. Each of the memory strings MS11 to MS1$m$ and MS21 to MS2$m$ may include at least one source select transistor SST, the plurality of memory cells MC, at least one pipe transistors PT, the plurality of memory cells MC, and at least one drain select transistor DST. In addition, each of the memory strings MS11 to MS1m and MS21 to MS2m may be arranged in a 'U' shape.

The pipe transistor PT may couple the memory cells MC on a drain side and the memory cells MC on a source side. In addition, a gate of the pipe transistor PT of each of the memory strings MS11 to MS1m and MS21 to MS2m may be coupled to a pipe line PL.

Because the other parts of the structures are similar to those described above with reference to FIG. 3, any repetitive detailed description of components already mentioned above will not be repeated.

Figure 5:
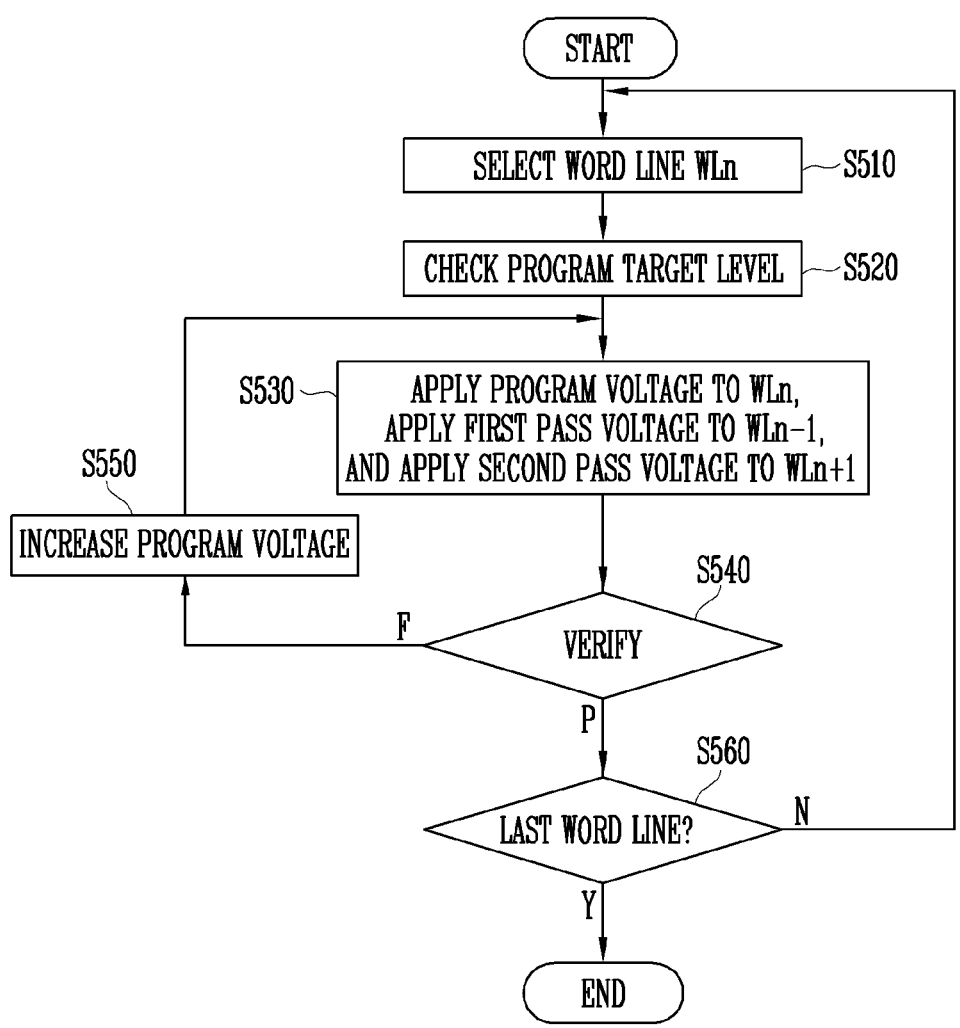
FIG. 5 is a flowchart illustrating a method of operating a semiconductor device according to an embodiment of the present disclosure.
Figure 6:
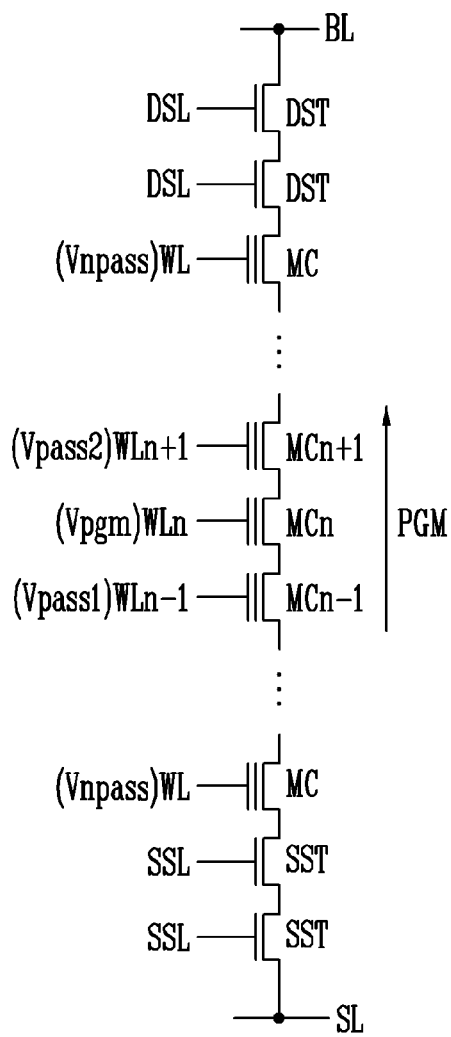
FIG. 6 is a circuit diagram of a memory string.

FIG. 5 is a flowchart illustrating a method of operating a semiconductor device according to an embodiment of the present disclosure. FIG. 6 is a circuit diagram of a memory string. The memory string of FIG. 6 may be included in the cell array described above with reference to FIGS. 2 to 4.

First, a word line WLn to program may be selected (S510). An nth memory cell MCn may be selected accordingly. In FIG. 5, n may be an integer of 1 or more. An (n−1)th memory cell MCn−1, the nth memory cell MCn and an (n+1)th memory cell MCn+1 may be coupled in series. The nth memory cell MCn may be coupled to the word line WLn. The (n−1)th memory cell MCn−1 adjacent to the nth memory cell MCn may be coupled to a word line WLn−1. The (n+1)th memory cell MCn+1 adjacent to the nth memory cell MCn may be coupled to a word line WLn+1.

A program target level of the selected memory cell MCn may be checked (S520). When a program operation is performed according to a TLC method, a programmed memory cell may have one of eight distributions and a program target level may be one of PV1 to PV7. When a program operation is performed according to a QLC method, a programmed memory cell may have one of sixteen distributions and a program target level may be one of PV1 to PV15.

The program target level is compared against a threshold value. The threshold value may be a reference for classifying the program target level and may be a threshold voltage. A single threshold value or a plurality of threshold values may be used depending on the number of distributions. By comparing at least one threshold value with the program target level, the program target level may be classified as a PV group having a relatively low threshold voltage, or a PV group having a relatively high threshold voltage.

The selected memory cell MCn may be programmed (S530). A program voltage Vpgm may be applied to the selected word line WLn. A program permission voltage, for example, a ground voltage, may be applied to a selected bit line BL. A program inhibition voltage, for example, a power voltage, may be applied to an unselected bit line BL.

When the program voltage Vpgm is applied, a pass voltage may be applied to unselected word lines. A first pass voltage Vpass1 or a second pass voltage Vpass1 may be applied to word lines adjacent to the selected word line WLn, among the unselected word lines. A normal pass voltage Vnpass may be applied to the remaining word lines, among the unselected word lines, i.e., non-adjacent word lines WL.

The adjacent word lines may include the word line WLn−1 adjacent to the selected word line WLn in a reverse direction to a program direction and the word line WLn+1 adjacent the selected word line WLn in the program direction. In addition, the "adjacent word line" may refer to a single word line right next to the selected word line WLn, or a plurality of neighboring word lines.

The first pass voltage Vpass1 may be applied to the word line WLn−1 adjacent to the selected word line WLn in the reverse program direction. The second pass voltage Vpass2 may be applied to the word line WLn+1 adjacent to the selected word line WLn in the program direction. Voltage levels of the first pass voltage Vpass1 and the selected pass voltage Vpass2 may be determined depending on the program target level of the selected memory cell MCn. When the program target level belongs to a low PV group, the first pass voltage Vpass1 may have a greater voltage level than the second pass voltage Vpass2. On the other hand, when the program target level belongs to a high PV group, the first pass voltage Vpass1 may have a lower voltage level than the second pass voltage Vpass2.

It may be verified whether the selected memory cell MCn has reached the program target level (S540). When verification fails (S540, F), the level of the program voltage Vpgm may be increased (S550) and the program voltage Vpgm may then be applied to the selected word line WLn (S530).

When verification passes (S540, P), it may be checked whether the selected word line WLn is the last word line (S560). When the selected word line WLn is the last word line (S560, Y), the program operation may be terminated. When another word line to program exists, the corresponding word line may be selected (S510). The program operation may be performed in a sequential manner from a memory cell MC adjacent to the source line SL to the memory cell MC adjacent to the bit line BL. For example, the (n−1)th memory cell MCn−1 and then the nth memory cell MCn and the (n+1)th memory cell MCn+1 may be programmed in a sequential manner. In another example, a program operation may be performed in a sequential manner from the memory cell MC adjacent to the bit line BL to the memory cell MC adjacent to the source line SL. Thus, the (n+1)th memory cell MCn+1 and then the nth memory cell MCn and the (n−1)th memory cell MCn−1 may be programmed in a sequential manner.

According to the above-described method, interference between adjacent memory cells may be reduced by controlling the levels of the first and second pass voltages Vpass1 and Vpass2 according to the program target level. Particularly, when the memory cells are stacked in a Z direction, interference between memory cells adjacent to each other in the Z direction may be reduced or prevented.

Figure 7A:
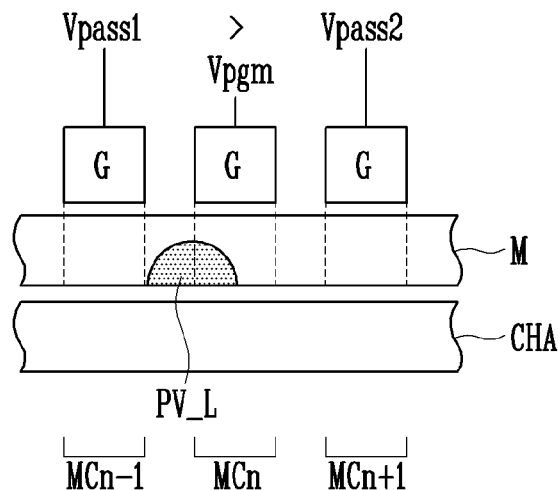
FIGS. 7A to 7C are schematic diagrams illustrating a method of operating a semiconductor device according to an embodiment of the present disclosure.
Figure 7B:
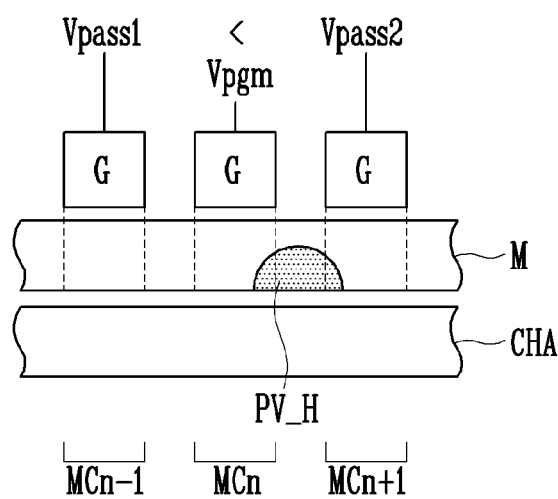
Figure 7C:
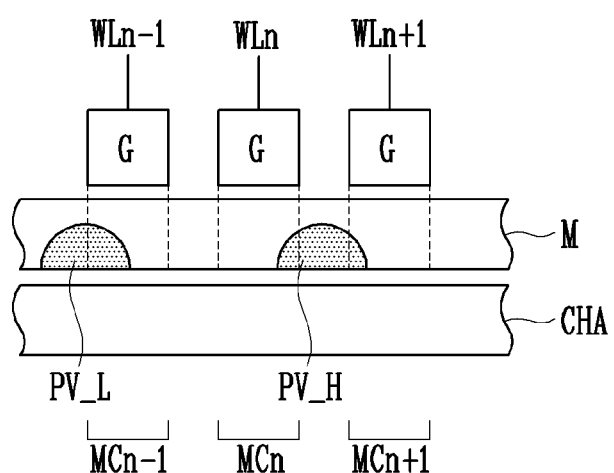

FIGS. 7A to 7C are schematic diagrams illustrating a method of operating a semiconductor device according to an embodiment of the present disclosure. FIGS. 7A to 7C show simplified views of the structures of the selected memory cell MCn and the memory cells MCn−1 and MCn+1 adjacent to the selected memory cell MCn, among memory cells included in a memory string.

Referring to FIGS. 7A to 7C, each of the memory cells MCn−1 to MCn+1 may include a channel layer CHA, a memory layer M and a gate electrode G. The memory layer M may store data and include a tunnel insulating layer, a data storage layer, and a charge blocking layer, or at least one of them. The data storage layer may include a floating gate, a charge trap material, polysilicon, a nitride, nanodots, a variable resistance material, and a phase change material. The gate electrodes G may be electrically coupled to each of the word lines WLn−1, WLn, and WLn+1. The gate electrodes G may be located at the same level or different levels.

The memory cells MCn−1 to MCn+1 belonging to the same memory string may share the memory layer M. For example, the memory cells may share the tunnel insulating layer, the data storage layer, and the charge blocking layer, or at least one of them. Therefore, when a program operation is performed, when the program voltage Vpgm is applied to the gate electrode G of the selected memory cell MCn, charges may be injected into a region of the memory layer M at a position corresponding to the selected memory cell MCn, thereby creating a charge distribution. The location of the charge distribution may be controlled by the first and second pass voltages Vpass1 and Vpass2 applied to the gate electrodes G of the adjacent memory cells MCn−1 and MCn+1.

Referring to FIG. 7A, the first pass voltage Vpass1 may have a higher voltage level than the second pass voltage Vpass2, as indicated by the '>' symbol. Therefore, a charge distribution PV_L of the selected memory cell MCn may be located adjacent to the (n−1)th memory cell MCn−1 to which the first pass voltage Vpass1 having a relatively high level is applied. For example, when the program target level belongs to a low PV group, the first pass voltage Vpass1 may be set to have a higher voltage level than the second pass voltage Vpass2. As a result, the charge distribution PV_L of the selected memory cell MCn may be inclined in a reverse program direction.

Referring to FIG. 7B, the first pass voltage Vpass1 may have a lower voltage level than the second pass voltage Vpass2, as indicated by the '<' symbol. Therefore, a charge distribution PV_H of the selected memory cell MCn may be located adjacent to the memory cell MCn+1 to which the second pass voltage Vpass2 having a relatively high voltage level is applied. For example, when the program target level belongs to a high PV group, the first pass voltage Vpass1 may be set to have a lower voltage level than the second pass voltage Vpass2. As a result, the charge distribution PV_H of the selected memory cell MCn may be inclined in a program direction.

FIG. 7C shows that after the (n−1)th memory cell MCn−1 is programmed to a low program level, the nth memory cell MCn may be programmed to a high program level. The (n−1)th memory cell MCn−1 may be programmed by the method as shown in FIG. 7A and the nth memory cell MCn may be programmed by the method as shown in FIG. 7B. The charge distribution PV_L of the (n−1)th memory cell MCn−1 which is a victim cell may be inclined in the reverse program operation, and the charge distribution PV_H of the nth memory cell MCn which is an attack cell may be inclined in the program direction. Therefore, by increasing the distance between the charge distribution PV_L of the (n−1)th memory cell MCn−1 and the charge distribution PV_H of the nth memory cell MCn, interference between the (n−1)th memory cell MCn−1 and the nth memory cell MCn may be reduced.

Figure 8A:
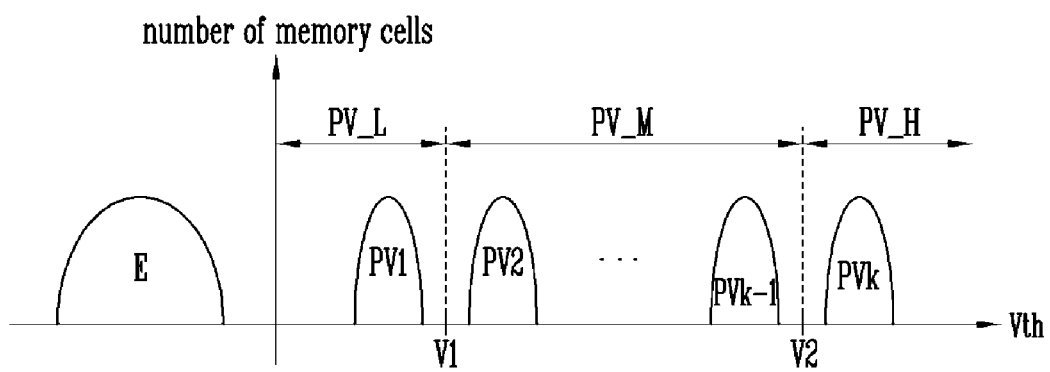
FIGS. 8A and 8B are cell distribution charts for illustrating a threshold value setting method for a semiconductor device according to an embodiment of the present disclosure.
Figure 8B:
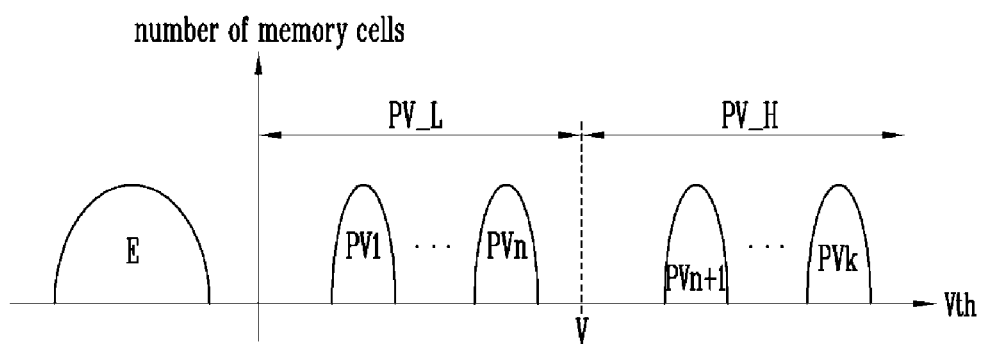

FIGS. 8A and 8B are cell distribution charts for illustrating a threshold value setting method for a semiconductor device according to an embodiment of the present disclosure.

Referring to FIGS. 8A and 8B, memory cells in an erase state may have a distribution E, and programmed memory cells may have one of k distributions. The memory cells may be programmed into one of the program levels PV1 to PVk. In terms of PV1 to PVk, k may be an integer of 2 or more.

Referring to FIG. 8A, the program levels PV1 to PVk may be classified using a plurality of threshold values. When a first threshold value V1 and a second threshold value V2 are used, the program levels PV1 to PVk may be classified into three PV groups. The second threshold value V2 may have a greater level than the first threshold value V1.

The program level PV1 having a threshold voltage less than the first threshold value V1 may be classified as a low PV group PV_L. The low PV group PV_L may include at least one program level including the lowest program level PV1. The program level PV1 having a threshold voltage greater than the second threshold value V2 may be classified as a high PV group PV_H. The high PV group PV_H may include at least one program level including the highest program level PVk. Program levels PV2 to PVk−1 having a threshold voltage which is greater than the first threshold value V1 and less than the second threshold value V2 may be classified as an intermediate PV group PV_M.

Referring to FIG. 8B, the program levels PV1 to PVk may be classified using one threshold value. When a threshold value V is used, the program levels PV1 to PVk may be classified into two PV groups. Program levels PV1 to PVn having a threshold voltage less than the threshold value V may be classified as the low PV group PV_L, and program levels PVn+1 to PVk having a threshold voltage greater than the threshold value V may be classified as the high PV group PV_H. In FIG. 8, n may be an integer of 1 or more.

According to the above-described method, the program levels PV1 to PVk may be classified using at least one threshold value. In addition, depending on which PV group the program target level of the selected memory cell belongs to, conditions of the program operation may be changed. For example, levels of pass voltages applied to adjacent memory cells may be changed.

Figure 9:
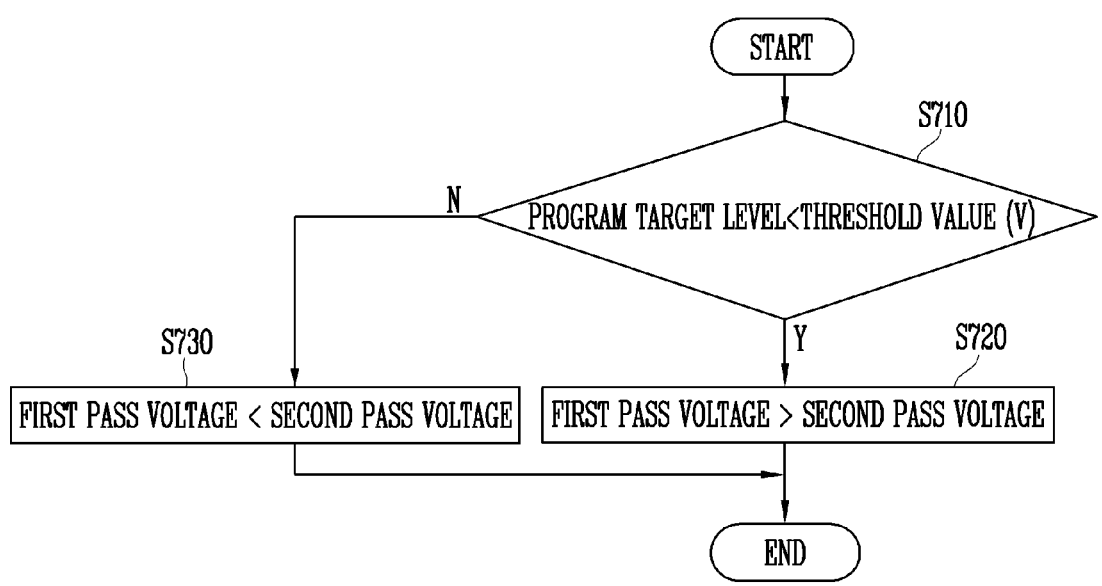
FIG. 9 is a flowchart illustrating a method of operating a semiconductor device according to an embodiment of the present disclosure.

FIG. 9 is a flowchart illustrating a method of operating a semiconductor device according to an embodiment of the present disclosure. Hereinafter, a method of checking a program target level of a selected memory cell using one threshold value and setting levels of first and second pass voltages is described.

Referring to FIGS. 6 and 9, first, the program target level of the selected memory cell MCn may be compared with the threshold value V (S710). As a result of the comparison, it may be determined that the program target level is less than the threshold value V (S710, Y). The above comparison result may mean that the program target level belongs to a low PV group and the selected memory cell MCn is a victim cell vulnerable to interference. Therefore, in response to the program target level being less than the threshold value V, the first pass voltage Vpass1 may be set to be greater than the second pass voltage Vpass1. The first pass voltage Vpass1 may have a higher voltage level than the normal pass voltage Vnpass, and the second pass voltage Vpass2 may have a lower voltage level than the normal pass voltage Vnpass. As a result, a charge distribution of the programmed memory cell MCn may be located adjacent to the (n−1)th memory cell MCn−1. In other words, the charge distribution of the programmed memory cell MCn may be inclined in the reverse program direction.

As a result of the comparison, it may be determined that the program target level is not lower than the threshold value V (S710, N). The above comparison result may mean that the program target belongs to a high PV group and the selected memory cell MCn is an attack cell causing interference. Therefore, in response to the program target level not being lower than the threshold value V, the first pass voltage Vpass1 may be set to be lower than the second pass voltage Vpass2 (S730). The first pass voltage Vpass1 may have a lower voltage level than the normal pass voltage Vnpass. The second pass voltage Vpass2 may have the substantially the same level as the normal pass voltage Vnpass, or may have a lower or higher voltage level than the normal pass voltage Vnpass. As a result, the charge distribution of the programmed memory cell MCn may be located adjacent to the memory cell MCn+1. In other words, the charge distribution of the programmed memory cell MCn may be inclined in the program direction.

Figure 10:
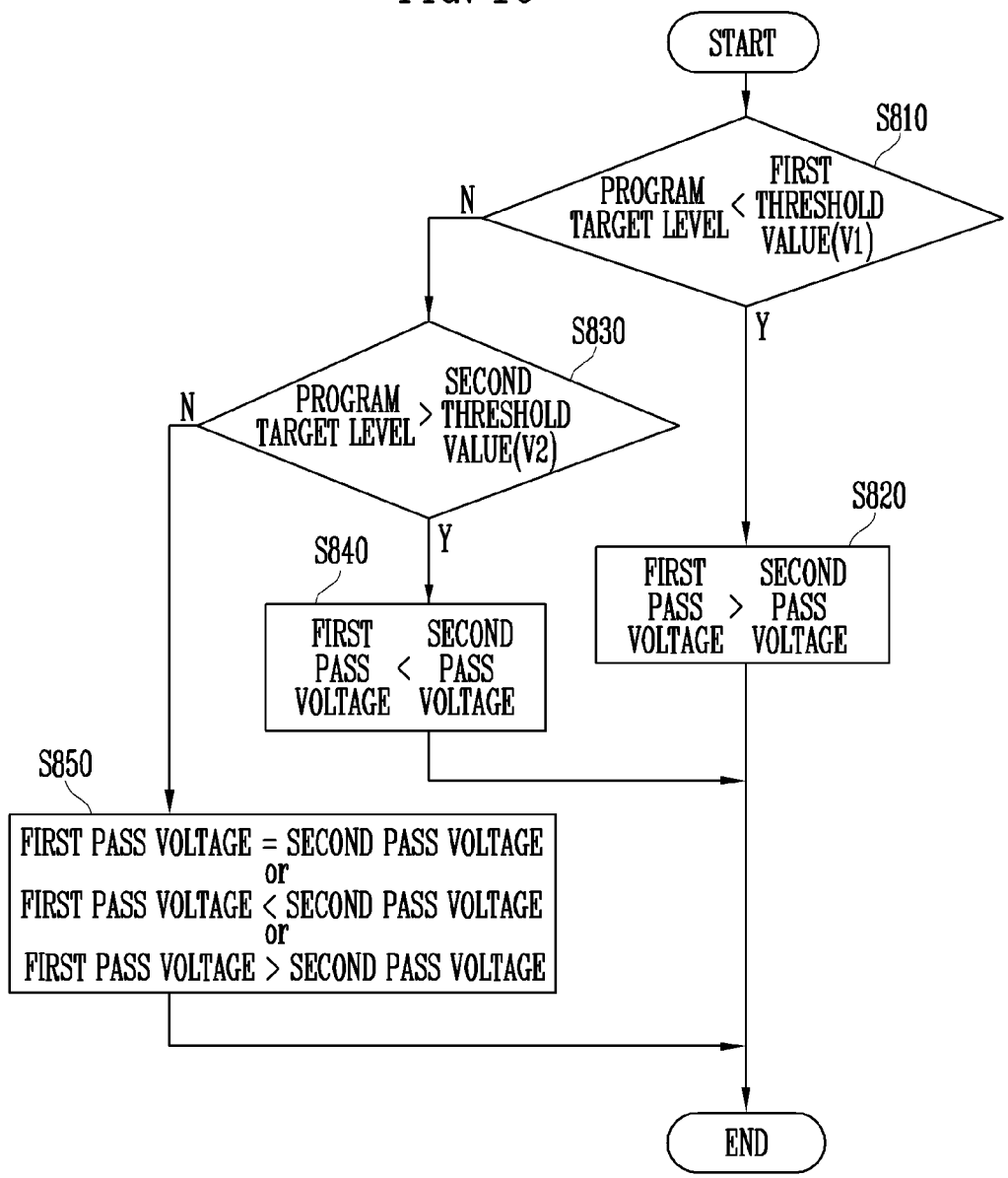
FIG. 10 is a flowchart illustrating a method of operating a semiconductor device according to an embodiment.

FIG. 10 is a flowchart illustrating a method of operating a semiconductor device according to an embodiment. Hereinafter, a method of checking a program target level of a selected memory cell using a plurality of threshold values and setting levels of first and second pass voltages is described.

Referring to FIGS. 6 and 10, first, the program target level of the selected memory cell MCn may be compared with the first threshold value V1 (S810). As a result of comparison, it may be determined that the program target level is less than the first threshold value V1 (S810, Y). The above comparison result may mean that the program target level belongs to a low PV group and the selected memory cell MCn is a victim cell vulnerable to interference. Therefore, in response to the program target level being lower than the first threshold value V1, the first pass voltage Vpass1 may be set to be greater than the second pass voltage Vpass2 (S820). The first pass voltage Vpass1 may have a higher voltage level than the normal pass voltage Vnpass and the second pass voltage Vpass2 may have a lower voltage level than the normal pass voltage Vnpass. As a result, the charge distribution of the programmed memory cell MCn may be located adjacent to the (n-1)th memory cell MCn-1. In other words, the charge distribution of the programmed memory cell MCn may be inclined in the reverse program direction.

As a result of the comparison, it may be determined that the program target level is not lower than the first threshold value V1 (S810, N). The above comparison result may mean that the program target level belongs to an intermediate PV group or a high PV group. Therefore, the program target level may be compared with the second threshold value V2 (S830).

As a result of the comparison, it may be determined that the program target level is greater than the second threshold value V2 (S830, Y). The above comparison result may mean that the program target level belongs to a high PV group and the selected memory cell MCn is an attack cell causing interference. Therefore, in response to the program target level being higher than the first threshold value V, the first pass voltage Vpass1 may be set to be lower than the second pass voltage Vpass2 (S840). The first pass voltage Vpass1 may have a lower voltage level than the normal pass voltage Vnpass. The second pass voltage Vpass2 may have substantially the same voltage level as the normal pass voltage Vnpass, or may have a lower or higher voltage level than the normal pass voltage Vnpass. As a result, the charge distribution of the programmed memory cell MCn may be located adjacent to the memory cell MCn+1. In other words, the charge distribution of the programmed memory cell MCn may be inclined in the program direction.

As a result of the comparison, it may be determined that the program target level is not higher than the second threshold value V2 (S830, N). The above comparison result may mean that the program target level belongs to the intermediate PV group. Therefore, in response to the program target level which is not greater than the second threshold value V2, the first pass voltage Vpass1 and the second pass voltage Vpass2 may be set (S850).

The first pass voltage Vpass1 and the second pass voltage Vpass2 may be set to have substantially the same voltage level. For example, the first pass voltage Vpass1 and the second pass voltage Vpass2 may be set to have substantially the same voltage level as the normal pass voltage Vnpass. The first pass voltage Vpass1 and the second pass voltage Vpass2 may be set to have different voltage levels. For example, the first pass voltage Vpass1 may be set to have a lower or higher voltage level than the second pass voltage Vpass2.

Figure 11A:
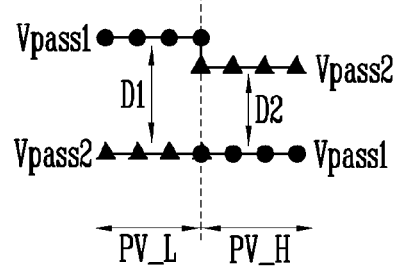
FIGS. 11A to 11C are diagrams illustrating a method of operating a semiconductor device according to an embodiment of the present disclosure.
Figure 11B:
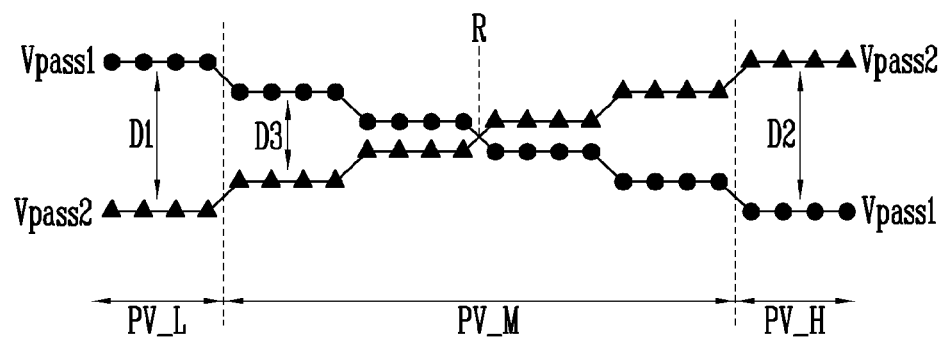
Figure 11C:
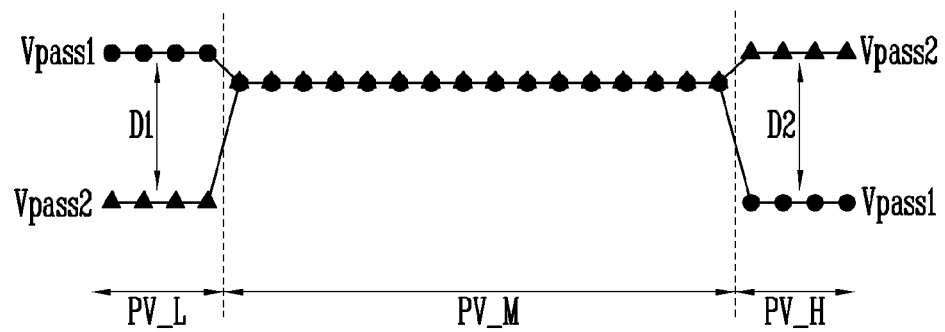

FIGS. 11A to 11C are diagrams illustrating a method of operating a semiconductor device according to an embodiment of the present disclosure. Hereinafter, a method of setting levels of first and second pass voltages according to a program target level of a selected memory cell is described below.

Referring to FIG. 11A, in the low PV group PV_L, the first pass voltage Vpass1 may have a greater voltage level than the second pass voltage Vpass2. There may be a first difference value D1 between the first pass voltage Vpass1 and the second pass voltage Vpass2 in the low PV group PV_L. When the first difference value D1 is larger, a charge distribution of a programmed memory cell may be further inclined in the reverse program direction.

In the high PV group PV_H, the first pass voltage Vpass1 may have a lower voltage level than the second pass voltage Vpass2. There may be a second difference value D2 between the first pass voltage Vpass1 and the second pass voltage Vpass2 in the high PV group PV_H. When the second difference value D2 is larger, the charge distribution of the programmed memory cell may be further inclined in the program direction. The first difference value D1 and the second difference value D2 may be substantially the same as each other, or the first difference value D1 may be greater than the second difference value D2 as illustrated in FIG. 11A.

Referring to FIG. 11B, in the intermediate PV group PV_M, the first pass voltage Vpass1 and the second pass voltage Vpass2 may have different voltage levels. There may be a third difference value D3 between the first pass voltage Vpass1 and the second pass voltage Vpass2 in the intermediate PV group PV_M may have. The third difference value D3 may be smaller than the first difference value D1 of the low PV group PV_L and smaller than the second difference value D2 of the high PV group PV_H.

When the program target level is low in the intermediate PV group PV_M, the first pass voltage Vpass1 may be set to be greater than the second pass voltage Vpass2. When the program target level is high in the intermediate PV group PV_M, the second pass voltage Vpass2 may be set to be greater than the first pass voltage Vpass1. In other words, in the intermediate PV group PV_M, the first and second pass voltages Vpass1 and Vpass2 may be set so that as the program level increases, the first pass voltage Vpass1 gradually decreases and the second pass voltage Vpass2 gradually increases. Thus, as the program level increases, the third difference value D3 may gradually decrease, and may gradually increase from an intersection point (R) where the voltage level of the first pass voltage Vpass1 and the voltage level of the second pass voltage Vpass2 cross each other.

Referring to FIG. 11C, in the intermediate PV group PV_M, the first pass voltage Vpass1 and the second pass voltage Vpass2 may have substantially the same voltage level. A charge distribution of a programmed memory cell might not be inclined in one direction and may be located to correspond to the corresponding memory cell. In addition, the first pass voltage Vpass1 and the second pass voltage Vpass2 may have substantially the same voltage level as the normal pass voltage Vnpass, or may have a lower or higher voltage level than the normal pass voltage Vnpass.

Figure 12:
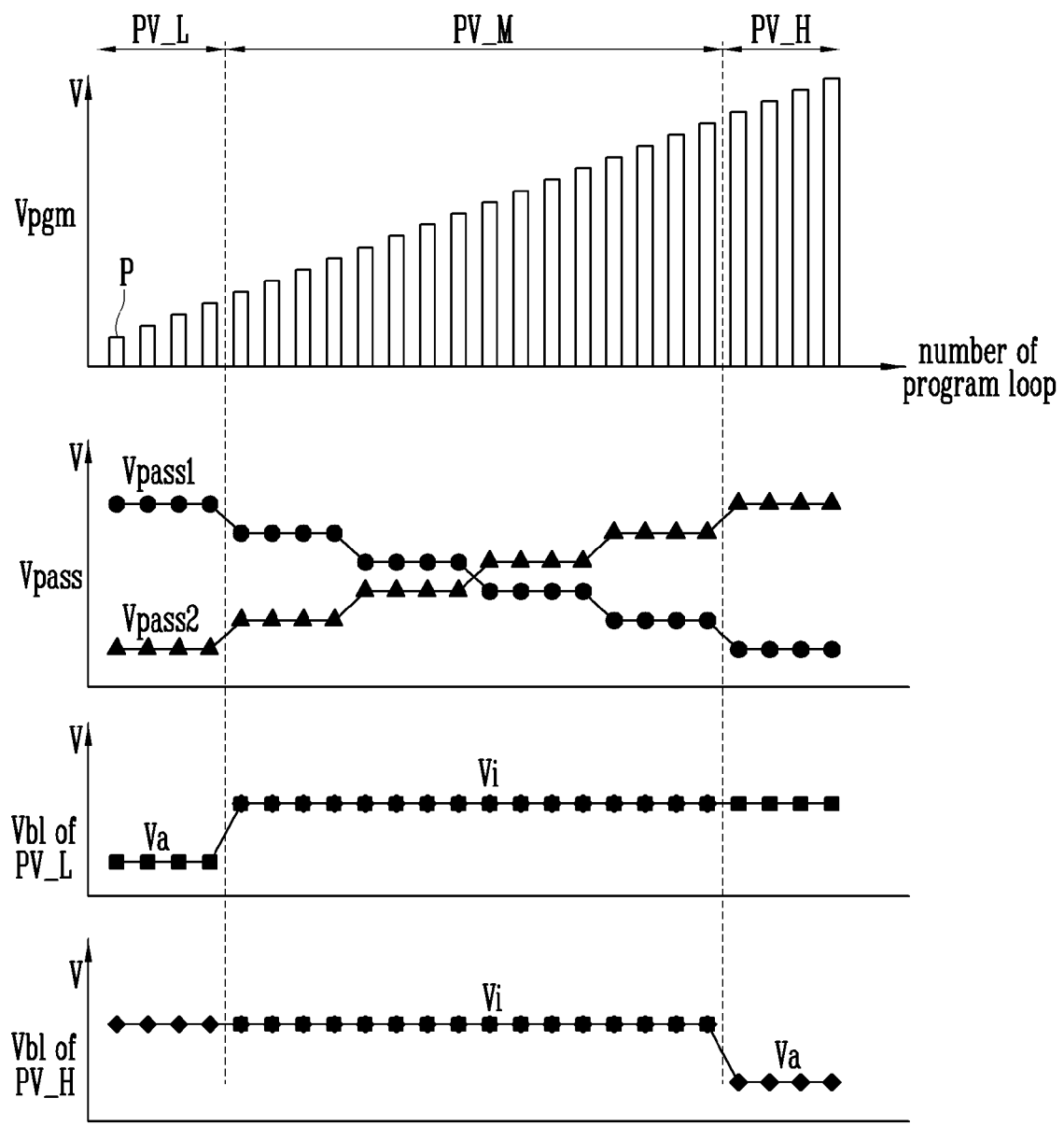
FIG. 12 is a diagram illustrating a method of operating a semiconductor device according to an embodiment of the present disclosure.

FIG. 12 is a diagram illustrating a method of operating a semiconductor device according to an embodiment of the present disclosure. Graphs of FIG. 12 are related to the program voltage Vpgm, a pass voltage Vpass and a bit line voltage Vbl. The X axis represents the number of program loops and the Y axis represents a voltage.

Referring to FIG. 12, a program operation may be performed by executing a plurality of program loops until a threshold voltage of a selected memory cell reaches a program target level.

According to an incremental step pulse programming (ISPP) method, a program loop may be repeated using a program pulse P in which the program voltage Vpgm is increased by a step voltage. In addition, though not illustrated in FIG. 12, each program loop may include at least one verify pulse between the program pulses P. A program pass or fail may be verified by applying a verify pulse to a selected word line. In a program loop corresponding to the low PV group PV_L, a program level belonging to the low PV group PV_L may be verified. In a program loop corresponding to the high PV group PV_H, a program level belonging to the high PV group PV_H may be verified.

When the program target level is less than the first threshold value, for example, when the program target level belongs to the low PV group PV_L, the first pass voltage Vpass1 may have a greater voltage level than the second pass voltage Vpass2. A program permission voltage Va may be applied to a corresponding bit line. The program permission voltage Va may be a ground voltage. When the program loop is repeated and the selected memory cell passes verification, a program inhibition voltage Vi may be applied to a corresponding bit line.

When the program target level is greater than the second threshold voltage, in a program loop corresponding to the low PV group PV_L and/or the intermediate PV group PV_M, the program inhibition voltage Vi may be applied to a corresponding bit line. When the program voltage Vpgm reaches the target level, i.e., when a program loop corresponding to the high PV group PV_H starts, the bit line voltage Vbl may drop to the program permission voltage Va from the program inhibition voltage Vi. The program permission voltage Va may be applied to a corresponding bit line. The program loop may be repeated. The first pass voltage Vpass1 may have a lower voltage level than the second pass voltage Vpass2. When the selected memory cell passes verification, the program inhibition voltage Vi may be applied to a corresponding bit line.

Figure 13:
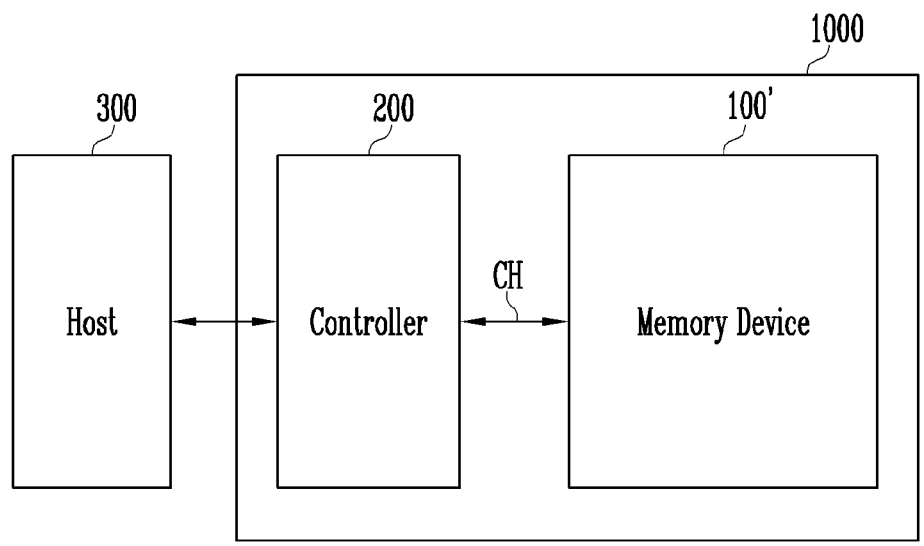
FIG. 13 is a block diagram illustrating the configuration of a memory system according to an embodiment of the present disclosure.

FIG. 13 is a block diagram illustrating the configuration of a memory system 1000 according to an embodiment of the present disclosure. Referring to FIG. 13, the memory system 1000 may include a semiconductor device 100' and a controller 200.

The controller 200 may control the semiconductor device 100' through a channel CH and the semiconductor device 100' may operate in response to control of the controller 200. The semiconductor device 100' may include a memory cell array having a plurality of memory blocks. According to an embodiment, the semiconductor device 100' may be the above-described semiconductor device 100, or a flash memory device.

The controller 200 may be configured to control the semiconductor device 100' in response to a request from a host 300. In addition, the semiconductor device 100' may receive a command and an address from the controller 200 through the channel CH and access an area selected from the memory cell array in response to the address. In other words, the semiconductor device 100' may perform an internal operation corresponding to the command on the area selected by the address.

The controller 200 may control the semiconductor device 100' to perform a program operation, a read operation, an erase operation, or the like. During the program operation, the controller 200 may provide a program command, an address, and data to the semiconductor device 100' through the channel CH, and the semiconductor device 100' may program the area selected by the address with data. During the erase operation, the controller 200 may provide an erase command and an address to the semiconductor device 100' through the channel CH, and the semiconductor device 100' may erase data stored in the area selected by the address. During the read operation, the controller 200 may provide a read command and an address to the semiconductor device 100' through the channel CH and read data from an area selected by the address. This read operation may include a read operation serving as verification entailed by a program operation or an erase operation as well as a read operation performed to read and output data stored in a memory cell.

When a program operation is requested by the host 300, the controller 200 may command the program operation to be performed by the semiconductor device 100' so that the program operation may be performed by the method as described above with reference to FIGS. 5 to 12. The semiconductor device 100' may perform a program operation by setting a first pass voltage to have a higher voltage level than a second pass voltage when a program target level of a selected memory cell is lower than a first threshold value, and by setting the first pass voltage to have a lower voltage level than the second pass voltage when the program target level is greater than a second threshold value. According to the above-described method, interference between adjacent memory cells may be reduced. Particularly, when the memory cells are stacked in a Z direction, interference in the Z direction may be reduced or prevented. As a result, reliability of the data programmed into the memory cells may be ensured.

Figure 14:
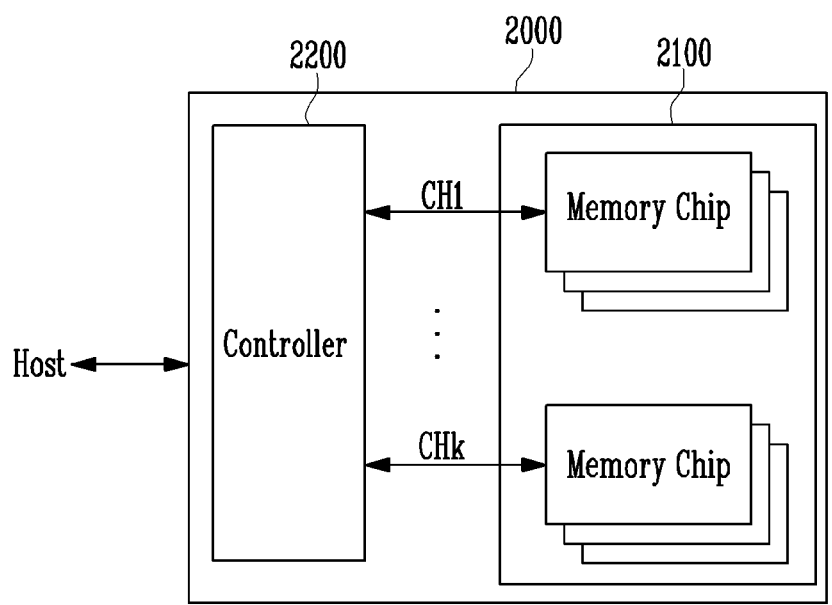
FIG. 14 is a block diagram illustrating the configuration a memory system according to an embodiment of the present disclosure.

FIG. 14 is a block diagram illustrating the configuration a memory system 2000 according to an embodiment of the present disclosure. Referring to FIG. 14, the memory system 2000 may include a memory device 2100 and a controller 2200.

The memory device 2100 may be a semiconductor device and include a plurality of memory chips. The semiconductor memory chips may be divided into a plurality of groups. The plurality of groups may communicate with the controller 2200 through first to kth channels CH1 to CHk. Each of the memory chips may be configured and operated in substantially the same manner as the semiconductor device 100 described above with reference to FIG. 1.

Each group may be configured to communicate with the controller 2200 through a single common channel. The controller 2200 may be configured in substantially the same manner as the controller 200 described with reference to FIG. 13, and configured to control the plurality of memory chips of the memory device 2100. The memory system 2000 may be modified so that a single memory chip may be coupled to a single channel.

The controller 2200 and the memory device 2100 may be integrated in one semiconductor device. According to an embodiment, the controller 2200 and the memory device 2100 may be integrated into a single semiconductor device to form a memory card. For example, the controller 2200 and the memory device 2100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 2200 and the memory device 2100 may be integrated in a single semiconductor device to form a solid state drive (SSD). The SSD may include a storage device for storing data in a memory. When the memory system 2000 is used as an SSD, operational rates of the host coupled to the memory system 2000 may be significantly improved.

In another example, the memory system 2000 may be provided as one of various elements of an electronic device such as a computer, a ultra-mobile PC (UMPC), a workstation, a net-book a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture player, a digital picture recorder, a digital video recorder, a device capable of transmitting/receiving information in an wireless environment, one of various devices for forming a home network, one of various electronic devices for forming a computer network, one of various electronic devices for forming a telematics network, an RFID device, or one of various elements for forming a computing system, or the like.

Figure 15:
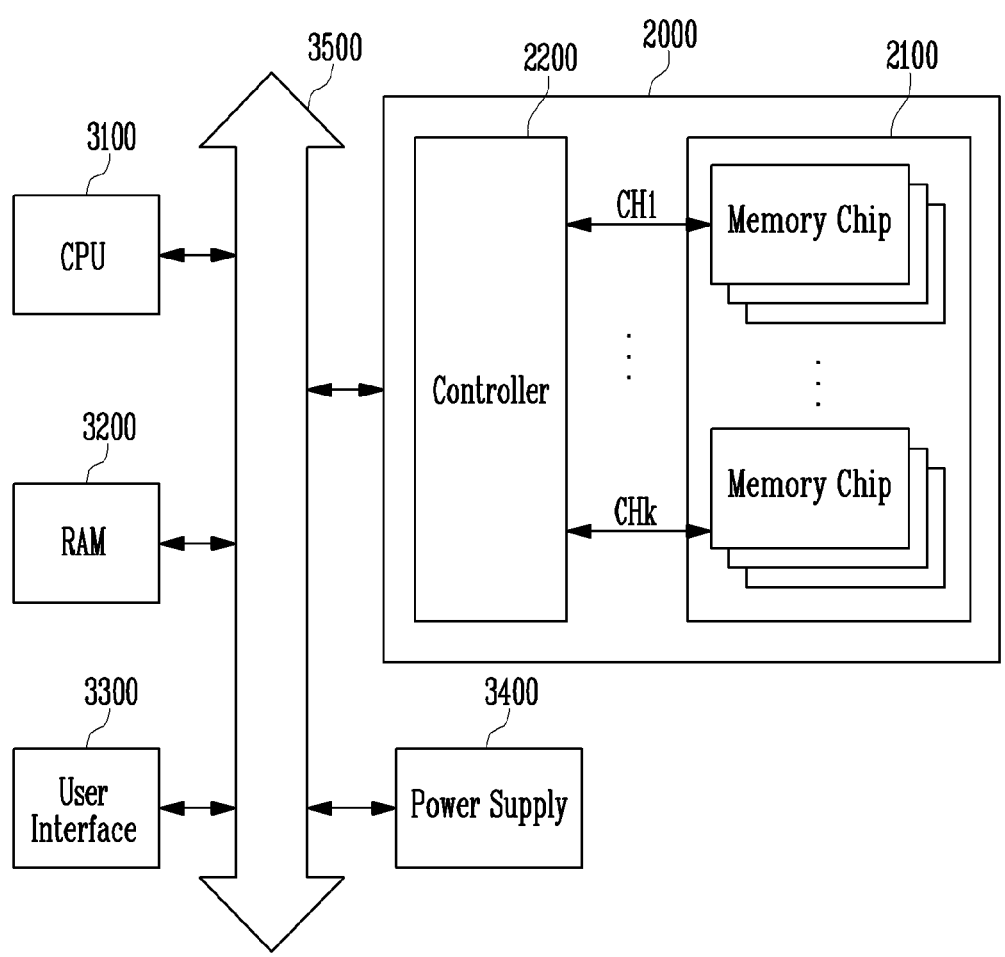
FIG. 15 is a block diagram illustrating the configuration of a computing system according to an embodiment of the present disclosure.

FIG. 15 is a block diagram illustrating the configuration of a computing system 3000 according to an embodiment of the present disclosure. Referring to FIG. 15, the computing system 3000 may include a central processing unit 3100, a random access memory (RAM) 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or data processed by the central processing unit 3100 may be stored in the memory system 2000.

The memory device 2100 may be coupled to the system bus 3500 through the controller 2200, or may be directly coupled to the system bus 3500. When the memory device 2100 is directly coupled to the system bus 3500, functions of the controller 2200 may be performed by the central processing unit 3100 and the RAM 3200.

The computing system 3000 may include the memory system 2000 described above with reference to FIG. 14, or the memory system 1000 described above with reference to FIG. 13. In addition, the computing system 3000 may be configured to include both memory systems 1000 and 2000 described above with reference to FIGS. 13 and 14.

According to various embodiments of the present disclosure, a semiconductor device having improved operating characteristics and improved reliability is provided along with an operating method of such a semiconductor device.

It will be apparent to those skilled in the art that various modifications can be made to any of the above-described embodiments of the present disclosure without departing from the spirit or scope of the present teachings. Thus, it is intended that the present teachings cover all such modifications provided they come within the scope of the appended claims and their equivalents.

What is claimed is:

1. A semiconductor device, comprising:
   a memory block configured to include a plurality of memory cells coupled to a plurality of word lines, respectively;
   peripheral circuits configured to perform a program operation to store data in selected memory cells which are coupled to a selected word line among the plurality of word lines, wherein the program operation includes a plurality of program loops; and
   a control logic configured to control the peripheral circuits to apply a first pass voltage and a second pass voltage respectively to a first unselected word line and a second unselected word line which are adjacent to the selected word line during the program voltage is applied to the selected word line, and to change the first pass voltage and the second pass voltage to decrease a voltage difference between the first pass voltage and the second pass voltage and increase the voltage difference while the program operation is performed.

2. The memory device of claim 1, wherein the first unselected word line is coupled to memory cells programmed before the selected memory cells are programmed.

3. The memory device of claim 1, wherein the second unselected word line is coupled to memory cells to be programmed after the selected memory cells are programmed.

4. The memory device of claim 1, wherein the control logic controls the first pass voltage has a higher voltage level than the second pass voltage in a program loop in which the program voltage is relatively small.

5. The memory device of claim 1, wherein the control logic controls the first pass voltage has a smaller voltage level than the second pass voltage in a program loop in which the program voltage is relatively high.

6. The memory device of claim 1, wherein the control logic controls the first pass voltage and the second pass voltage to have at least three voltage levels, respectively during the plurality of program loops.

7. The memory device of claim 1,
   wherein the plurality of program loops include first to n-th program loops, and
   the voltage difference between the first pass voltage and the second pass voltage is decreased from the first program loop to a (2/n)-th program loop.

8. The memory device of claim 1,
   wherein the plurality of program loops include first to n-th program loops, and
   the voltage difference between the first pass voltage and the second pass voltage is increased from a (2/n)-th program loop to the n-th program loop.

9. The memory device of claim 1, wherein the control logic controls the first pass voltage to be gradually decreased during the program operation.

10. The memory device of claim 1, wherein the control logic controls the second pass voltage to be gradually increased during the program operation.

11. An operating method for a memory device including a plurality of memory cells coupled to a plurality of word lines, respectively, the method comprising:
    applying a program voltage to a selected word line among the plurality of word lines; and
    applying a first pass voltage and a second pass voltage respectively to a first unselected word line and a second unselected word line which are adjacent to the selected word line during the program voltage is applied to the selected word line, wherein a voltage difference between the first pass voltage and the second pass voltage is decreased and increased according to a voltage level of the program voltage.

12. The method of claim 11, wherein the applying the first pass voltage and the second pass voltage comprises applying, in response to the program voltage having a lower voltage level than a first threshold voltage, the first pass voltage to the first unselected word line and applying the second pass voltage having a higher voltage level than the first pass voltage to the second unselected word line.

13. The method of claim 11, wherein the applying the first pass voltage and the second pass voltage comprises applying, in response to the program voltage having a higher voltage level than a first threshold voltage, the first pass voltage to the first unselected word line and applying the second pass voltage having an equal voltage level to the first pass voltage to the second unselected word line.

14. The method of claim 11, wherein the applying the first pass voltage and the second pass voltage comprises applying, in response to the program voltage having a higher voltage level than a second threshold voltage, the first pass voltage to the first unselected word line and applying the second pass voltage having a lower voltage level than the first pass voltage to the second unselected word line.

15. The method of claim 11, wherein the first unselected word line is coupled to memory cells programmed before the program operation is performed.

16. The method of claim 11, wherein the second unselected word line is coupled to memory cells to be programmed after the program operation is performed.

17. A semiconductor device, comprising:
a memory block configured to include a plurality of memory cells coupled to a plurality of word lines, respectively;
peripheral circuits configured to perform a program operation to store data in selected memory cells which are coupled to a selected word line among the plurality of word lines, wherein the program operation includes a plurality of program loops; and
a control logic configured to control the peripheral circuits to apply a first pass voltage and a second pass voltage respectively to a first unselected word line and a second unselected word line which are adjacent to the selected word line during the program voltage is applied to the selected word line, to control the first pass voltage and the second pass voltage to have at least three voltage levels, respectively, and to control the first pass voltage and the second pass voltage to decrease and increase a voltage difference between the first pass voltage and the second pass voltage during the program operation.

18. The memory device of claim 17, wherein the first unselected word line is coupled to memory cells programmed before the selected memory cells are programmed.

19. The memory device of claim 17, wherein the second unselected word line is coupled to memory cells to be programmed after the selected memory cells are programmed.

20. The memory device of claim 17, wherein the control logic controls the peripheral circuits to gradually increase the first pass voltage and gradually decrease the second pass voltage throughout the program operation.

* * * * *